Oct. 24, 1972 R. S. KEEN, JR 3,700,508
FABRICATION OF INTEGRATED MICROCIRCUIT DEVICES
Filed June 25, 1970
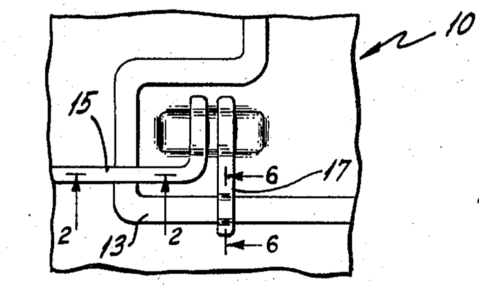
FIG. 1.
FIG. 2.
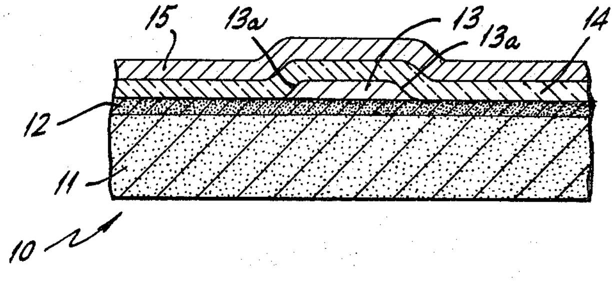
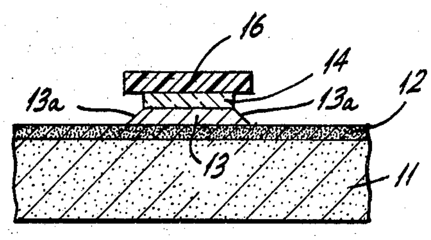
FIG. 4.
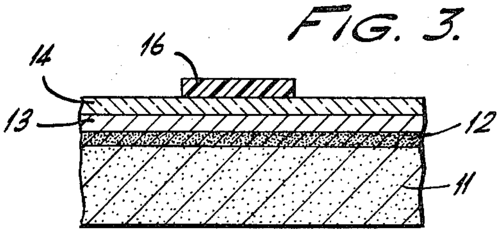
FIG. 3A.
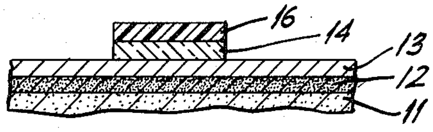
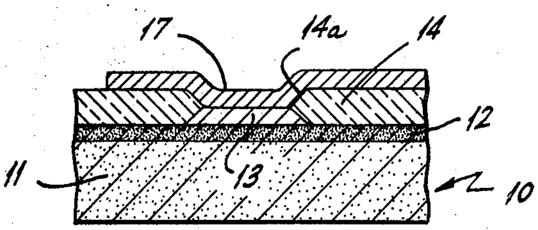
FIG. 6.
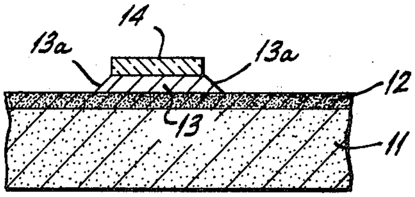
FIG. 5.
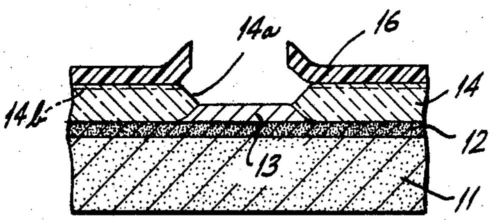
FIG. 8.
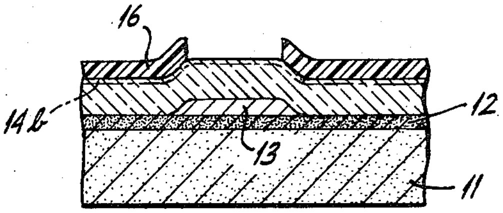
FIG. 7.
INVENTOR.
RALPH S. KEEN JR.
BY
Harry W. Hargis III
AGENT United States Patent Office 3,700,508
Patented Oct. 24, 1972

3,700,508

FABRICATION OF INTEGRATED MICROCIRCUIT DEVICES

Ralph S. Keen, Jr., Harleysville, Pa., assignor to General Instrument Corporation, Newark, N.J.

Filed June 25, 1970, Ser. No. 49,697
Int. Cl. C03c *15/00;* C23f *1/02*
U.S. Cl. 156—3 12 Claims

ABSTRACT OF THE DISCLOSURE

A process for manufacturing microcircuit devices having multi-level interconnection wiring formed as metal layers separated by layers of dielectric material. To avoid the development of cracks in overlying layers of dielectric material, tapered edges are formed on the underlying metal layer. Prior to photolithographic etching to form the wiring, the metal layer is covered with a relatively thin layer of phosphosilicate glass, as the dielectric, and photoresist is applied thereto. After the photoresist is developed, the exposed glass is removed by subjecting it to an HF etchant solution. Then the exposed surfaces of glass and metal are subjected to a solution of a metal etchant and a glass etchant. As the glass is removed by its etchant, the photoresist is undercut, thereby exposing to the metal etchant progressively more of the upper surface of the metal, with resultant formation of sloped or tapered edges on the metal wiring. The relative etch rates, as between the metal and the glass, is used to determine the angle of slope.

BACKGROUND OF THE INVENTION

This invention relates to integrated microcircuit devices, and more particularly to improvements in the fabrication of devices of the type having multi-level interconnection wiring circuits.

In devices of the aforementioned type, reliability problems have arisen because relatively thick metal interconnection patterns characteristically have steep edge portions which render it difficult to deposit a continuous dielectric layer over these edge portions. Cracks tend to develop in an overlying glass layer, in regions of sharp discontinuities presented by the steep edge portions of the metal. As a result, a subsequently applied metal interconnection layer is prone to form electrical shorts through cracks in the glass to an underlying circuit pattern. Moreover, these same cracks in the dielectric layer render it difficult to apply continuous metal films thereon in the formation of additional interconnections.

In a similar vein, there is a tendency for metal interconnections to fail in regions of discontinuities in the surfaces of an underlying layer of glass.

These problems can be overcome by tapering the edges of the circuit patterns, and it is a general objective of this invention to provide an improved, consistently reliable, and controllable method for achieving such tapered edge portions.

SUMMARY OF THE INVENTION

In achievement of the foregoing as well as other objectives, the invention is directed to improvements in the fabrication of microcircuit devices of the type having multi-level interconnection wiring in the form of metal layers separated by layers of dielectric material. The invention specifically contemplates an improved method for the formation of tapered edge portions on such layers in the regions of overlap therebetween. The improved method comprises disposition of a relatively thin upper etchable layer of material over the layer to be delineated, followed by application of a photoresist mask in the pattern of delineation over the upper layer. The exposed regions of the layers are subjected to an etchant solution effective both to remove undesired regions of the layers and to undercut the photoresist mask which has the effect of forming tapered edge portions on the layer undergoing delineation. It is a feature of the method contemplated by the invention that the degree of taper may be controlled readily by appropriate selection of the compositions of both the etchant solution and the layers subjected to the etchant solution. For example, if the superposed layers etch at the same rate, the angle of slope will be found to be about 45°.

The manner in which the foregoing as well as other objectives and advantages of the invention may best be achieved will be more clearly understood from a consideration of the following detailed description of the preferred practice of the invention, taken in light of the accompanying drawing.

BRIEF DESCRIPTION OF THE DRAWING

FIG. 1 is a plan view, on a greatly enlarged scale, of a portion of a device made according to the invention;

FIG. 2 is a sectional view, on a still larger scale, of the device seen in FIG. 1, taken along a plane indicated generally by arrows 2—2 applied to FIG. 1;

FIGS. 3 and 3A to 5 are sectional views similar to FIG. 2, and illustrating one aspect of the method contemplated by the invention and by which the structure seen in FIG. 2 is achieved;

FIG. 6 is a sectional view similar to FIG. 2, but taken along a plane indicated by arrows 6—6 applied to FIG. 1; and FIGS. 7 and 8 are sectional views illustrative of another aspect of the method contemplated by the invention, and by which method the structure best seen in FIG. 6 is made.

It will be appreciated that for convenience of illustration dimensions of some elements have been exaggerated.

DESCRIPTION OF THE PREFERRED PRACTICE OF THE INVENTION

With more detailed reference to the drawing, and first to FIGS. 1 and 2, a microcircuit device 10 made using the method contemplated by the present invention comprises a silicon substrate 11 having an oxide coating 12. Aluminum interconnection wires, one of which is seen at 13, extend over the oxide coating 12 and both the wire 13 and the oxide coating are covered with a layer of dielectric material, such as phosphosilicate glass 14. As best seen in FIG. 2, the opposite edge portions **13*a* of wire 13 are tapered. Another set of aluminum interconnection wires, one of which is seen at 15, extend over glass 14**.

It will be appreciated that although the aluminum interconnection wires 13, 15 have been shown in full lines in FIG. 1, they are in fact separated by the layer of phosphosilicate glass 14, as seen in FIG. 2. Edge portions **13*a* of the interconnection wires are sloped or tapered to ensure against fracture of both the glass layer 14 and the wire 15** in the regions of surface discontinuities created by wiring crossovers. Although advantages afforded by the tapered sections have been recognized, the underlying reasons are not fully understood. It is thought that the relatively smooth surface transition afforded by the tapering ensures continuity of the layers as they are applied one over the other, in contrast with an apparent tendency of non-tapered edge portions to reject the material forming the layer extending thereover, with resultant creation of discontinuities in the layer.

Turning now to the improved process contemplated by the invention for achieving the above described tapered structure, and first with reference to FIG. 3, a silicon substrate 11, coated with the usual oxide layer 12 of about 5,000 to 8,000 A. in thickness, has a layer of aluminum 13 of about 10,000 A. in thickness applied thereto, all in accordance with known techniques. A layer 14 of phosphosilicate glass about 1,000 A. in thickness is then applied, for example by vapor deposition in accordance with the process disclosed and claimed in my copending patent application Ser. No. 884,974, filed Dec. 15, 1969, and assigned to the assignee of the present invention. Deposition of layer 14 is followed by application of a pattern of photoresist 16 corresponding to the desired delineation of the first metal layer 13 to form the interconnection wires denoted, for the sake of convenience, by the same numeral. As seen in FIG. 3A, the exposed regions of glass 14 are then removed using an HF acid etchant, thereby exposing the corresponding portions of aluminum layer 13 also to be removed.

With reference further to FIG. 4, the exposed layer 13 of aluminum is then subjected to an etchant solution including a component that also will serve as an etchant for the layer 14 of phosphosilicate glass underlying the pattern of photoresist 16. It will of course be understood that, if desired, the step illustrated in FIG. 3A may be omitted. In such event, the combined glass-metal etchant solution would be applied, first removing the exposed (i.e. unmasked) glass, and thereafter removing both glass and aluminum, in the manner described in what follows. As etching of the aluminum layer 13 proceeds, the glass etchant will remove exposed portions of glass layer 14 beneath resist 16 in a substantially horizontal direction, thereby undercutting the photoresist. This removal of portions of the glass layer progressively exposes more and more of the upper edge surface regions of aluminum interconnection 13 to the aluminum etchant. Since the metal etching proceeds downwardly, as well as horizontally, the regions of metal initially etched are subjected to the etchant for a longer period of time than the later exposed edge increments uncovered by progressive removal of the glass beneath the resist. Since the depth of etch is a function of time, a taper results.

It desired, the etchant solution may be balanced so that the rate at which the glass 14 is etched substantially is equal to the rate at which the aluminum 13 is etched, so that each of the resulting tapered edge portions 13*a* will have a slope of approximately 54° relative to the surface of oxide coating 12. It will of course be understood that the degree of slope, or taper, will be governed by such considerations as the overall width of the metal layer and its thickness. The process contemplated by the present invention readily lends itself to control of the taper. As to a further aspect of the method, it will be appreciated that layer 12 is not harmed by the etchant, since layer 14 of phosphosilicate glass and portions 13*a* of aluminum are etched much more rapidly than the layer 12 of oxide once it is finally exposed.

A typical combined aluminum and glass etchant solution (A), useful in the hereinabove described process, comprises the following elements, in the amounts indicated.

| | Cc. |
|---|---|
| HCl | 100 |
| $H_3PO_4$ | 100 |
| $H_2O$ | 100 |
| HF, 500 cc.<br>$NH_4F$, 1000 gms.<br>$H_2O$, 1500 cc. | 5 |

A suitable surfactant is used with solution (A) which when maintained at about 75° C. for an etching period of about 3 minutes, achieves a taper of about 45° of a 10,000 A. thickness of aluminum.

Following formation of the tapered edges 13*a* as seen in FIG. 4, the photoresist mask 16 is removed and the 1,000 A. thickness of phosphosilicate glass 14 may be removed if desired. However the layer 14, as seen in FIG. 4, need not be removed since the next layer of material to be applied to the device will be a layer, also shown at 14 in FIG. 2, of the same phosphosilicate glass, to a thickness of about 10,000 A. The second layer 15 of aluminum is applied according to known techniques over the surface of the last-mentioned layer of phosphosilicate glass.

An etchant solution (B) composed of the following elements, in the amounts indicated, has also been found useful in the hereinabove described metal and glass etching process.

| | | |
|---|---|---|
| $H_3PO_4$ | cc. | 3000 |
| $HNO_3$ | cc. | 600 |
| HAc | cc. | 200 |
| $H_2O$ | cc. | 400 |
| $AlAc_3$ | gms. | 100 |
| $NH_4HF_2$ | gms. | 85 |
| FC–95 | gms. | 0.6 |

(where $Ac=C_2O_2H_3$).

FC–95 is the trade name for a fluorochemical, anionic surfactant available from the 3M Company, St. Paul, Minn., $NH_4HF_2$ is the glass etchant, and the remaining components are the aluminum etchant.

Etchant solution (B) maintained at about 65° C. will etch a 10,000 A. layer of aluminum, having thereover a layer of phosphosilicate glass, to a tapered edge of about 30°. By increasing the temperature of the etchant solution, the angle of taper can be increased.

With reference to FIG. 6, it has also been found desirable to taper the edges, as seen at 14*a*, of glass 14 defining an opening therein and through which a connection is made between wires 13 and 17 crossing as shown in FIG. 1. This construction ensures against the formation of cracks where the metal connection 17 extends from the glass 14 onto the other metal connection 13. This construction is achieved by employing a conventional layer 14 of phosphosilicate glass (FIG. 7) of about 10,000 A. in thickness and, during the last phase of deposition, substantially increasing the phosphorus concentration to form a sub-layer 14*b* having a thickness of about 500 A. Masking, such as photoresist 16, is then applied, as seen in FIG. 7, and the masked surface subjected to a conventional glass etchant solution, such as, for example, $NH_4HF_2$ as disclosed hereinabove. Since the relatively thin surface layer 14*b* of phosphosilicate glass 14 will be etched away more rapidly than the remaining main portion of the layer, the photoresist 16 is undercut, as seen in FIG. 8, and the tapered edge 14*a* is formed. The angle of taper can be controlled by varying the phosphorus content of layer 14*b*. For example, increasing the phosphorus content will result in a decreased angle of taper of edges 14*a*.

While only two metal layers separated by a glass layer are shown, more layers can be incorporated. The taper is used whenever the material is to be covered by an overlying layer, and the last or top layer need not be tapered.

I claim:

1. In the fabrication of microcircuit devices of the general type comprising a substrate of semiconductive material over surface portions of which extend multilevel interconnection wiring in the form of delineated layers of metal separated by layers of dielectric material, a method for forming tapered edge portions on at least one of a pair of adjacent layers in regions of overlap therebetween, comprising the steps of: disposing a first etchable layer of material over a second etchable layer comprising one of the above recited materials to be delineated; applying a pattern of photoresist of the desired delineation over said first etchable layer of material; and subjecting exposed regions of said first and second layers of etchable material to an etchant solution effective to remove undesired regions of both layers, said solution, as it removes said first layer of material, undercutting the photoresist and progressively exposing more surface of said second layer of material, thereby to form tapered edge portions thereon.

2. The method according to claim 1, and further characterized in that said first layer of material is more rapidly etchable than said second layer of material.

3. The method according to claim 1, and further characterized in that said first layer of material comprises phosphosilicate glass, and said second layer of material comprises aluminum.

4. The method according to claim 3, and further characterized in that said first layer is about 1,000 A. in thickness, and said second layer is about 10,000 A. in thickness.

5. The method according to claim 1, and further characterized in that said first and second layers of material are composed of phosphosilicate glass, the recited first layer being defined by phosphosilicate glass having a higher concentration of phosphorus than the phosphosilicate glass which defines said second layer.

6. The method according to claim 5, and further characterized in that said first layer is about 500 A. in thickness, and said second layer is about 10,000 A. in thickness.

7. The method according to claim 3, and further including the step of etching said second layer to form elements of the recited interconnection wiring.

8. The method according to claim 5, and further characterized in that said first and second layers of glass are deposited over a layer of metal, and said pattern of photoresist is applied to delineate an opening in the recited composite layer of glass through which opening a portion of a subsequently applied layer of metal may extend into electrical connection with a layer of metal underlying the composite layer of glass.

9. In the fabrication of semiconductive devices of the type having a substrate of semiconductive material over surface portions of which extend multi-level interconnection wiring in the form of etchable metal layers separated by layers of etchable dieletcric material, a method for forming tapered edge portions on at least one of a pair of adjacent layers in regions of overlap therebetween, comprising: applying a relatively thin layer of etchable material over one of the recited layers prior to delineation thereof; applying a pattern of masking resist of the desired delineation over said relatively thin layer of material; and subjecting said layers of material to an etchant solution capable of etching both the relatively thin layer of material and the layer of material to be delineated, said solution as it removes the relatively thin layer of material undercutting the resist and progressively exposing more surface of the layer of material to be delineated, thereby to form tapered edge portions thereon.

10. The method according to claim 9, and further characterized in that said relatively thin layer comprises phosphosilicate glass, said layer to be delineated comprises metal, and said etchant solution includes a glass and a metal etchant.

11. The method according to claim 9, and further characterized in that said one layer of material comprises phosphosilicate glass, said relatively thin layer comprises phosphosilicate glass having a higher phosphorus concentration than the glass of said one layer, and said etchant solution comprises a glass etchant.

12. The method according to claim 9, and further characterized in that the material of said thin layer is more rapidly etchable than the material of the layer to be delineated.

References Cited

UNITED STATES PATENTS

| | | | |
|---|---|---|---|
| 3,326,729 | 6/1967 | Sigler | 156—17 X |
| 3,418,227 | 12/1968 | Cecil | 156—7 X |
| 3,497,407 | 2/1970 | Esch et al. | 156—17 |
| 3,542,551 | 11/1970 | Rice | 156—17 X |
| 3,544,401 | 12/1970 | Jarman | 156—17 |

WILLIAM A. POWELL, Primary Examiner

U.S. Cl. X.R.

156—15, 17